United States Patent
Demos et al.

(10) Patent No.: US 7,670,924 B2
(45) Date of Patent: Mar. 2, 2010

(54) AIR GAP INTEGRATION SCHEME

(75) Inventors: Alexandros T. Demos, Fremont, CA (US); Li-Qun Xia, Cupertino, CA (US); Bok Hoen Kim, San Jose, CA (US); Derek R. Witty, Fremont, CA (US); Hichem M'Saad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 82 days.

(21) Appl. No.: 12/017,930

(22) Filed: Jan. 22, 2008

(65) Prior Publication Data

US 2008/0182404 A1    Jul. 31, 2008

Related U.S. Application Data

(60) Provisional application No. 60/887,079, filed on Jan. 29, 2007.

(51) Int. Cl.
    *H01L 21/76*    (2006.01)
(52) U.S. Cl. .................. 438/421; 438/409; 438/931; 257/E21.17; 257/E21.54; 257/E21.58; 257/E21.218; 257/E21.229
(58) Field of Classification Search .................. 438/421, 438/409, 82, 96, 99, 105, 680, 692, 700, 438/712, 725, 740, 745, 931
See application file for complete search history.

(56) References Cited

U.S. PATENT DOCUMENTS

| | | | |
|---|---|---|---|
| 5,461,003 A | 10/1995 | Havemann et al. | |
| 5,936,295 A | 8/1999 | Havemann et al. | |
| 6,054,379 A | 4/2000 | Yau et al. | |
| 6,071,805 A | 6/2000 | Liu | |
| 6,165,890 A | 12/2000 | Kohl et al. | |
| 6,287,979 B1 | 9/2001 | Zhou et al. | |
| 6,380,106 B1 | 4/2002 | Lim et al. | |
| 6,753,258 B1 | 6/2004 | Gaillard et al. | |
| 6,780,753 B2 * | 8/2004 | Latchford et al. | 438/619 |
| 6,790,788 B2 | 9/2004 | Li et al. | |

(Continued)

OTHER PUBLICATIONS

PCT International Search Report and Written Opinion dated May 21, 2008 for International Application No. PCT/US08/51731.

(Continued)

*Primary Examiner*—David Nhu
(74) *Attorney, Agent, or Firm*—Patterson & Sheridan

(57) ABSTRACT

Methods are provided for forming a structure that includes an air gap. In one embodiment, a method is provided for forming a damascene structure comprises depositing a porous low dielectric constant layer by a method including reacting an organosilicon compound and a porogen-providing precursor, depositing a porogen-containing material, and removing at least a portion of the porogen-containing material, depositing an organic layer on the porous low dielectric constant layer by reacting the porogen-providing precursor, forming a feature definition in the organic layer and the porous low dielectric constant layer, filing the feature definition with a conductive material therein, depositing a mask layer on the organic layer and the conductive material disposed in the feature definition, forming apertures in the mask layer to expose the organic layer, removing a portion or all of the organic layer through the apertures, and forming an air gap adjacent the conductive material.

18 Claims, 3 Drawing Sheets

U.S. PATENT DOCUMENTS

| | | | |
|---|---|---|---|
| 6,890,850 B2 * | 5/2005 | Lee et al. | 438/631 |
| 6,936,183 B2 | 8/2005 | Chinn et al. | |
| 6,984,577 B1 | 1/2006 | Zhao et al. | |
| 7,060,330 B2 | 6/2006 | Zheng et al. | |
| 7,094,689 B2 | 8/2006 | Su et al. | |
| 7,098,149 B2 | 8/2006 | Lukas et al. | |
| 7,115,517 B2 | 10/2006 | Ye et al. | |
| 7,166,524 B2 | 1/2007 | Al-Bayati et al. | |
| 7,205,233 B2 | 4/2007 | Lopatin et al. | |
| 7,208,413 B2 | 4/2007 | Byun et al. | |
| 7,226,853 B2 | 6/2007 | Bekiaris et al. | |
| 7,238,604 B2 | 7/2007 | Kloster et al. | |
| 2002/0058411 A1 | 5/2002 | Hasegawa et al. | |
| 2004/0156987 A1 | 8/2004 | Yim et al. | |
| 2005/0124172 A1 | 6/2005 | Townsend, III et al. | |
| 2005/0153073 A1 | 7/2005 | Zheng et al. | |
| 2005/0215065 A1 | 9/2005 | Nguyen et al. | |
| 2005/0230834 A1 | 10/2005 | Schmitt et al. | |
| 2005/0233591 A1 | 10/2005 | Schmitt et al. | |
| 2006/0043591 A1 | 3/2006 | Yim et al. | |
| 2006/0079099 A1 | 4/2006 | Nguyen et al. | |
| 2006/0105106 A1 | 5/2006 | Balseanu et al. | |
| 2006/0121721 A1 | 6/2006 | Lee et al. | |
| 2006/0216926 A1 | 9/2006 | Ye et al. | |
| 2007/0099417 A1 | 5/2007 | Fang et al. | |
| 2007/0134435 A1 * | 6/2007 | Ahn et al. | 427/515 |
| 2008/0182403 A1 | 7/2008 | Noori et al. | |
| 2009/0093112 A1 | 4/2009 | Al-Bayati et al. | |

OTHER PUBLICATIONS

PCT International Search Report and Written Opinion for International Application No. PCT/US2008/51715 dated May 21, 2008.

* cited by examiner

AIR GAP INTEGRATION SCHEME

CROSS-REFERENCE TO RELATED APPLICATIONS

This application claims benefit of U.S. Provisional Patent Application Ser. No. 60/887,079, filed Jan. 29, 2007, which is herein incorporated by reference. This application is related to U.S. Provisional Patent Application Ser. No. 60/886,872, filed Jan. 26, 2007, which was filed conventionally as U.S. patent application Ser. No. 12/017,879, on Jan. 22, 2008.

BACKGROUND OF THE INVENTION

1. Field of the Invention

Embodiments of the present invention generally relate to the fabrication of integrated circuits. More particularly, embodiments of the present invention relate to methods for forming damascene structures, including damascene structures that include an air gap.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.1 µm feature sizes, and tomorrow's facilities soon will be producing devices having even smaller feature sizes.

The continued reduction in device geometries has generated a demand for layers having lower dielectric constant (k) values because the capacitive coupling between adjacent metal lines must be reduced to further reduce the size of devices on integrated circuits. In particular, insulators having low dielectric constants, less than about 4.0, are desirable. Examples of insulators having low dielectric constants include spin-on glass, fluorine-doped silicon glass (FSG), carbon-doped oxide, and polytetrafluoroethylene (PTFE), which are all commercially available.

More recently, low dielectric constant organosilicon layers having k values less than about 3.5 have been developed. One method that has been used to develop low dielectric constant organosilicon layers has been to deposit the layers from a gas mixture comprising an organosilicon compound and a compound comprising thermally labile species or volatile groups and then post-treat the deposited layers to remove the thermally labile species or volatile groups, such as organic groups, from the deposited layers. The removal of the thermally labile species or volatile groups from the deposited layers creates nanometer-sized voids in the layers, which lowers the dielectric constant of the layers, e.g., to about 2.5, as air has a dielectric constant of approximately 1.

However, in view of the continuing decrease in integrated circuit feature sizes and increase in circuit density, there remains a need for a method of forming devices that have dielectric layers with even lower dielectric constants.

SUMMARY OF THE INVENTION

The present invention generally provides a method for forming a damascene structure, and in particular, provides a method for forming a damascene structure that includes an air gap. In one embodiment, a method is provided for forming a damascene structure comprises depositing a porous low dielectric constant layer by a method including reacting an organosilicon compound and a porogen-providing precursor, depositing a porogen-containing material, and removing at least a portion of the porogen-containing material, depositing an organic layer on the porous low dielectric constant layer by reacting the porogen-providing precursor, forming a feature definition in the organic layer and the porous low dielectric constant layer, filing the feature definition with a conductive material therein, depositing a mask layer on the organic layer and the conductive material disposed in the feature definition, forming apertures in the mask layer to expose the organic layer, removing a portion or all of the organic layer through the apertures, and forming an air gap adjacent the conductive material.

In another embodiment, a method is provided for forming a damascene structure including depositing a porous low dielectric constant layer by a method including reacting an organosilicon compound and alpha-terpinene, depositing an alpha-terpinene containing material, and removing at least a portion of alpha-terpinine in the alpha-terpinene containing material, depositing an amorphous carbon layer on the porous low dielectric constant layer by reacting alpha-terpinene, forming a feature definition in the amorphous carbon layer and the porous low dielectric constant layer, filing the feature definition with a conductive material therein, depositing a silicon carbide-based material on the amorphous carbon layer and the conductive material disposed in the feature definition, forming apertures in the silicon carbide-based material to expose the amorphous carbon layer, removing a portion or all of the amorphous carbon layer through the apertures, and forming an air gap adjacent the conductive material.

In another embodiment, a method is provided for forming a damascene structure including depositing a porous low dielectric constant layer by a method including reacting an organosilicon compound and alpha-terpinene, depositing an alpha-terpinene containing material, and removing at least a portion of alpha-terpinine in the alpha-terpinene containing material, in situ depositing an amorphous carbon layer on the porous low dielectric constant layer by reacting alpha-terpinene, forming a feature definition in the amorphous carbon layer and the porous low dielectric constant layer, filing the feature definition with a conductive material therein, depositing a silicon carbide-based material on the amorphous carbon layer and the conductive material disposed in the feature definition, forming apertures in the silicon carbide-based material to expose the amorphous carbon layer, removing a portion or all of the amorphous carbon layer through the apertures by a plasma etch process, a wet etch process, an annealing process, an electronic (eBeam) cure process, an ultra-violet light curing process, or a combination thereof, forming an air gap adjacent the conductive material, and depositing a non-porous low dielectric constant layer on the silicon-carbide layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a method for forming a damascene structure that includes an air gap. The air gap is generally formed by depositing an organic layer, forming an interconnect, such as a horizontal interconnect or trench, in the organic layer, filling the interconnect with a conductive material, depositing a layer over the organic layer and the conductive material in the via, and removing all or a portion of the organic layer through apertures in the layer over the organic layer. The removal of all or a portion of the organic layer creates air gaps in a dielectric layer that was formed from the organic layer. The formation of the air gaps in the dielectric layer lowers the dielectric constant of the dielectric layer.

In another aspect, the present invention also provides a via-first method of forming a dual damascene structure. A via-first method of forming a dual damascene structure and a method for forming a damascene structure that includes an air gap will be described below with respect to FIGS. 1A-1O.

Figure 1A:
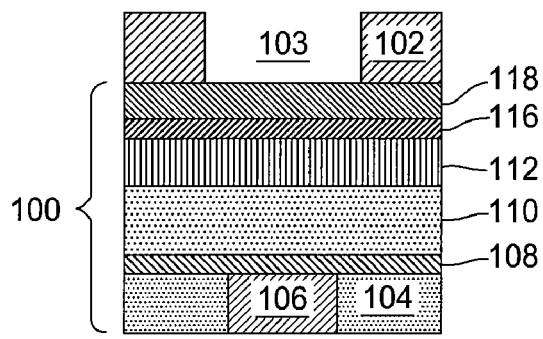
FIGS. 1A-1O are cross-sectional views of a structure during a damascene processing sequence according to an embodiment of the invention.

FIG. 1A shows a structure 100 that includes a first photoresist material 102 thereon. The first photoresist material 102 has a first pattern 103 therein. The structure includes a substrate layer 104 having a conductive feature 106 formed therein. Barrier layer 108 is located over the conductive feature 106 and the substrate layer 104. Barrier layer 108 may be a silicon carbide layer or a doped silicon carbide layer, such as a BLOk® layer, available from Applied Materials, Inc. of Santa Clara, Calif.

A first dielectric layer 110 is formed over the barrier layer 108. The first dielectric layer 110 may be a porous low dielectric constant layer, which may be a silicon oxycarbide layer (SiOC). The dielectric constant (k) of the layer 110 may be about 3.0 or less, such as about 2.5 or less. The porous low dielectric constant layer may be deposited by a method comprising reacting an organosilicon compound and a porogen-providing precursor, such as a hydrocarbon compound, to deposit a silicon oxycarbide layer and then removing the porogen material, such as organic material from the hydrocarbon compound, in the layer to create pores in the layer. The porogen material may be removed by a post-treatment such as a UV treatment or an electron beam treatment.

One embodiment of a method of forming a porous low dielectric constant layer is as follows. A porogen-providing precursor including one or more organic compounds having at least one cyclic group and one or more organosilicon compounds are reacted with an oxidizing gas in amounts sufficient to deposit a low dielectric constant layer on a semiconductor substrate. The layer may be deposited using plasma assistance within a processing chamber capable of performing chemical vapor deposition (CVD). The plasma may be generated using pulse RF, high frequency RF, dual frequency, dual phase RF, or any other known or yet to be discovered plasma generation technique. Following deposition of the layer, the layer may be processed, such as cured by electron beam, to remove pendant organic groups, such as cyclic groups of the organic compounds that have been incorporated into the layer network during deposition.

The curing step supplies energy to the layer network to volatize and remove at least a portion of the cyclic groups in the layer network, leaving behind a more porous layer network having a lower dielectric constant. In most cases, the cured layer demonstrates a hardness at least two times, and as much as 600%, more than a non-cured layer deposited according to embodiments described herein. Layers cured using e-beam show an unexpected reduction in k value and an unexpected increase in hardness, not achievable with conventional curing techniques. Typically, the cured layer has a dielectric constant of about 2.5 or less, preferably about 2.2 or less, and a hardness greater than about 0.6 GPa.

The term "organosilicon compound" as used herein is intended to refer to compounds containing carbon atoms in organic groups, and can be cyclic or linear. Organic groups may include alkyl, alkenyl, cyclohexenyl, and aryl (what others) groups in addition to functional derivatives thereof. Preferably, the organosilicon compounds includes one or more carbon atoms attached to a silicon atom whereby the carbon atoms are not readily removed by oxidation at suitable processing conditions. The organosilicon compounds may also preferably include one or more oxygen atoms. In one aspect, a preferred organosilicon compound has an oxygen to silicon atom ratio of at least 1:1, and more preferably at least 2:1, such as about 4:1.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

1,3,5-trisilano-2,4,6-trimethylene, -(—$SiH_2CH_2$—)$_3$- (cyclic)
2,4,6,8-tetramethylcyclotetrasiloxane (TMCTS) -(—$SiHCH_3$—O—)$_4$- (cyclic)
octamethylcyclotetrasiloxane (OMCTS), -(—$Si(CH_3)_2$—O—)$_4$- (cyclic)
2,4,6,8,10-pentamethylcyclopentasiloxane, -(—$SiHCH_3$—O—)$_5$- (cyclic)
1,3,5,7-tetrasilano-2,6-dioxy-4,8-dimethylene, -(—$SiH_2$—$CH_2$—$SiH_2$—O—)$_2$- (cyclic)
hexamethylcyclotrisiloxane -(—$Si(CH_3)_2$—O—)$_3$- (cyclic)

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

methylsilane, $CH_3$—$SiH_3$
dimethylsilane, $(CH_3)_2$—$SiH_2$
trimethylsilane, $(CH_3)_3$—SiH
ethylsilane, $CH_3$—$CH_2$—$SiH_3$
disilanomethane, $SiH_3$—$CH_2$—$SiH_3$
bis(methylsilano)methane, $CH_3$—$SiH_2$—$CH_2$—$SiH_2$—$CH_3$
1,2-disilanoethane, $SiH_3$—$CH_2$—$CH_2$—$SiH_3$
1,2-bis(methylsilano)ethane, $CH_3$—$SiH_2$—$CH_2$—$CH_2$—$SiH_2$—$CH_3$
2,2-disilanopropane, $SiH_3$—$C(CH_3)_2$—$SiH_3$
diethoxymethylsilane (DEMS), $CH_3$—$Si^H$—(O—$CH_2$—$CH_3$)$_2$
1,3-dimethyldisiloxane, $CH_3$—$SiH_2$—O—$SiH_2$—$CH_3$
1,1,3,3-tetramethyldisiloxane, $(CH_3)_2$—SiH—O—SiH—$(CH_3)_2$
hexamethyldisiloxane (HMDS), $(CH_3)_3$—Si—O—Si—$(CH_3)_3$
1,3-bis(silanomethylene)disiloxane, ($SiH_3$—$CH_2$—$SiH_2$—)$_2$—O
bis(1-methyldisiloxanyl)methane, ($CH_3$—$SiH_2$—O—$SiH_2$—)$_2$—$CH_2$
2,2-bis(1-methyldisiloxanyl)propane, ($CH_3$—$SiH_2$—O—$SiH_2$—)$_2$—$C(CH_3)_2$ hexamethoxydisiloxane (HMDOS) $(CH_3O)_3$—Si—O—Si—$(OCH_3)_3$ dimethyidimethoxysilane (DMDMOS) $(CH_3O)_2$—Si—$(CH_3)_2$ dimethoxymethylvinylsilane (DMMVS) $(CH_3O)_2$—Si—$(CH_3)$—$CH_2$=$CH_3$ The porogen-providing precursor including one or more organic compounds having at least one cyclic group, referred to as a porogen or porogen material. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as a ketone, ether, and ester. Some exemplary compounds having at least one cyclic group include alpha-terpinene (ATP), vinylcyclohexane (VCH), and phenylacetate, just to name a few.

Suitable oxidizing gasses include oxygen ($O_2$), ozone ($O_3$), nitrous oxide ($N_2O$), carbon monoxide (CO), carbon dioxide ($CO_2$), water ($H_2O$), 2,3-butane dione or combinations thereof. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

The e-beam treatment typically has a dose between about 50 and about 2000 micro coulombs per square centimeter ($\mu c/cm^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 500 $\mu c/cm^2$ at 400° C. Although any e-beam device may be used, one exemplary device is the EBK chamber, available from Applied Materials, Inc.

The e-beam curing process improves mechanical strength of the deposited layer network and also lowers the k-value. The energized e-beam alters the chemical bonding in the molecular network of the deposited layer and removes at least a portion of the molecular groups from the layer. The removal of the molecular groups creates voids or pores within the layer, lowering the k value. The e-beam treatment also strengthens the layer network by cross-linking Si—O—Si or Si—C—Si chains as inferred from FTIR spectroscopy.

Preferably, the deposited layer has a carbon content between about 10 and about 30 atomic percent, such as between about 10 and about 30 atomic percent after curing. The carbon content of the deposited layers refers to an elemental analysis of the layer structure. The carbon content is represented by the percent of carbon atoms in the deposited layer, excluding hydrogen atoms, which are difficult to quantify. For example, a layer having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

During deposition, the substrate is typically maintained at a temperature between about −20° C. and about 450° C. A power density ranging between about 0.03 W/cm$^2$ and about 3.2 W/cm$^2$, which is a RF power level of between about 10 W and about 2000 W for a 200 mm substrate is typically used. Preferably, the RF power level is between about 300 W and about 1700 W. The RF power is provided at a frequency between about 0.01 MHz and 300 MHz. The RF power may be cycled or pulsed to reduce heating of the substrate and promote greater porosity in the deposited layer. The RF power may also be continuous or discontinuous. An exemplary processing chamber for depositing a low dielectric layer according to embodiments described herein is described below.

The following examples illustrate the low dielectric layers of the present invention. The layers were deposited on 200 mm substrates using a chemical vapor deposition chamber, such as the "Producer DxZ" system, available from Applied Materials, Inc. of Santa Clara, Calif.

EXAMPLE 1

A low dielectric constant layer was deposited on each of three 200 mm substrates at about 8 Torr and temperature of about 200° C. The following processing gases and flow rates were used:

Alpha-terpinene (ATP), at 3,000 mgm;
Diethoxymethylsilane (DEMS), at 800 mgm; and
Carbon dioxide, at 1,000 sccm.

Each substrate was positioned 300 mils from the gas distribution showerhead. A power level of 600 W at a frequency of 13.56 MHz was applied to the showerhead for plasma enhanced deposition of the layers. Each layer was deposited at a rate of about 2,700 A/min, and had a dielectric constant (k) of about 5.4 measured using SSM 5100 Hg CV measurement tool at 0.1 MHz. Each layer also exhibited a hardness of about 0.1 GPa.

Thermal Anneal:

The first deposited layer was subjected to a thermal anneal process. The anneal treatment utilized a temperature of about 425° C. at a pressure of about 10 Torr in an inert gas environment for about 4 hours. Shorter anneal times resulted in higher k values. The thermally annealed layer had a lowest k value of about 2.1 and a hardness of about 0.2 GPa.

E-BEAM @ 400° C.:

The second deposited layer was subjected to a high temperature electron beam (e-beam) treatment using a dose of about 300 $\mu c/cm^2$, at about 4.5 KeV and 1.5 mA, and at about 400° C. The e-beam treatment lasted for about 2 minutes. Following the e-beam treatment, the layer exhibited a dielectric constant of about 2.1 which is about 60% less than the non-cured layers and similar to the lowest value of the thermally annealed layer. The e-beam layer also exhibited a hardness of about 0.7 GPa, which is about an 600% increase compared to the non-cured layers, and a 250% increase compared to the thermally annealed layer.

E-BEAM at Room Temperature:

The third deposited layer was subjected to a low temperature electron beam (e-beam) treatment using a dose of about 300 $\mu c/cm^2$, at about 4.5 KeV and 1.5 mA, and at about 35° C. The e-beam treatment lasted for about 2 minutes. Following the e-beam treatment, the layer exhibited a dielectric constant of about 2.3 which is about 57% less than the non-cured layers. The e-beam layer also exhibited a hardness of about 0.5 GPa, which is about an 400% increase compared to the non-cured layers, and a 150% increase compared to the thermally annealed layer.

EXAMPLE 2

A low dielectric constant layer was deposited on each of three substrates at about 8 Torr and temperature of about 225° C. The following processing gases and flow rates were used:
- Alpha-terpinene (ATP), at 3,000 mgm;
- Diethoxymethylsilane (DEMS), at 800 mgm;
- Carbon dioxide, at 1,500 sccm; and
- Oxygen, at 100 sccm.

Each substrate was positioned 300 mils from the gas distribution showerhead. A power level of 600 W at a frequency of 13.56 MHz was applied to the showerhead for plasma enhanced deposition of the layers. Each layer was deposited at a rate of about 1,800 A/min, and had a dielectric constant (k) of about 2.85 measured using SSM 5100 Hg CV measurement tool at 0.1 MHz. Each layer also exhibited a hardness of about 0.23 GPa.

Thermal Anneal:

The first deposited layer was subjected to a thermal anneal process. The anneal treatment utilized a temperature of about 450° C. at a pressure of about 10 Torr in an inert gas environment for about 30 minutes. Shorter anneal times resulted in higher k values. The thermally annealed layer had a refractory index (RI) of about 1.29, a lowest k value of about 2.08, and a hardness of about 0.23 GPa.

E-BEAM @ 400° C. and 200 µc/cm$^2$:

The second deposited layer was subjected to a high temperature electron beam (e-beam) treatment using a dose of about 200 µc/cm$^2$, at about 4.5 KeV and 1.5 mA, and at about 400° C. The e-beam treatment lasted for about 100 seconds. Following the e-beam treatment, the layer exhibited a dielectric constant of about 2.07 which is about 27% less than the non-cured layers and similar to the lowest value of the thermally annealed layer. The e-beam layer also exhibited a hardness of about 0.42 GPa, which is about an 80% increase compared to the non-cured layers and the thermally annealed layer.

E-BEAM @ 400° C. and 500 µc/cm$^2$:

The third deposited layer was subjected to a low temperature electron beam (e-beam) treatment using a dose of about 500 µc/cm$^2$, at about 4.5 KeV and 1.5 mA, and at about 35° C. The e-beam treatment lasted for about 250 seconds. Following the e-beam treatment, the layer exhibited a dielectric constant of about 2.14 which is about 25% less than the non-cured layers. The e-beam layer also exhibited a hardness of about 0.74 GPa, which is about a 220% increase compared to the non-cured layers and the thermally annealed layer.

EXAMPLE 3

A low dielectric constant layer was deposited on each of two substrates at about 8 Torr and a temperature of about 225° C. The following processing gases and flow rates were used:
- Alpha-terpinene (ATP), at 4,000 mgm;
- Octamethylcyclotetrasiloxane (OMCTS), at 200 mgm;
- Oxygen, at 200 sccm; and
- Carbon dioxide 2,000 sccm.

Each substrate was positioned about 300 mils from the gas distribution showerhead. A power level of 500 W at a frequency of 13.56 MHz was applied o the showerhead for plasma enhanced deposition of the layers. Each layer was deposited at a rate of about 1,000 A/min, and had a dielectric constant (k) of about 4.0 measured using SSM 5100 Hg CV measurement tool at 0.1 MHz. Each layer also exhibited a hardness of about 0.1 GPa.

E-BEAM @ 400° C. and 120 Micro c/cm$^2$:

The first deposited layer was subjected to a high temperature electron beam (e-beam) treatment using a dose of about 120 micro c/cm2, at about 4.5 KeV and 1.5 mA, and at about 400° C. The e-beam treatment lasted for about 30 seconds. Following the e-beam treatment, the layer exhibited a dielectric constant of about 1.9 which is about 52% less than the non-cured layers. The e-beam layer also exhibited a hardness of about 0.5 GPa, which is about a 400% increase compared to the non-cured layers.

E-BEAM @ 400° C. and 600 micro c/cm$^2$:

The second deposited layer was subjected to a low temperature electron beam (e-beam) treatment using a dose of about 600 micro c/cm2, at about 4.5 KeV and 1.5 mA, and at about 400° C. The e-beam treatment lasted for about 150 seconds. Following the e-beam treatment, the layer exhibited a dielectric constant of about 2.2, which is about 45% less than the non-cured layers. The e-beam layer also exhibited a hardness of about 0.8 GPa, which is about a 700% increase compared to the non-cured layers.

EXAMPLE 4

A low dielectric constant layer was deposited on a substrate at about 8 Torr and a temperature of about 225° C. The following processing gases and flow rates were used:
- ATP, at 3,000 mgm;
- TMS, at 500 sccm;
- DEMS, at 600 mgm;
- Oxygen, at 100 sccm; and
- Carbon dioxide, at 1,500 sccm.

The substrate was positioned about 300 mils from the gas distribution showerhead. A power level of 600 W at a frequency of 13.56 MHz was applied o the showerhead for plasma enhanced deposition of the layers. The layer was deposited at a rate of about 2,000 A/min, and had a dielectric constant (k) of about 4.3 measured using SSM 5100 Hg CV measurement tool at 0.1 MHz. The layer also exhibited a hardness of about 0.1 GPa.

E-BEAM @400° C. and 200 Micro c/cm$^2$:

The deposited layer was subjected to a high temperature electron beam (e-beam) treatment using a dose of about 200 micro c/cm2, at about 4.5 KeV and 1.5 mA, and at about 400° C. The e-beam treatment lasted for about 30 seconds. Following the e-beam treatment, the layer exhibited a dielectric constant of about 2.2 which is about 50% less than the non-cured layer. The e-beam layer also exhibited a hardness of about 0.7 GPa, which is about a 600% increase compared to the non-cured layer.

EXAMPLE 5

A low dielectric constant layer was deposited on a substrate at about 8 Torr and a temperature of about 225° C. The following processing gases and flow rates were used:
- ATP, at 4,000 mgm;
- TMS, at 1,000 sccm;
- OMCTS, at 200 mgm
- Oxygen, at 100 sccm; and
- Carbon dioxide, at 1,500 sccm.

The substrate was positioned about 300 mils from the gas distribution showerhead. A power level of 500 W at a frequency of 13.56 MHz was applied o the showerhead for plasma enhanced deposition of the layers. The layer was deposited at a rate of about 1,600 A/min, and had a dielectric constant (k) of about 4.5 measured using SSM 5100 Hg CV measurement tool at 0.1 MHz. The layer also exhibited a hardness of about 0.1 GPa.

E-BEAM @ 400° C. and 200 Micro c/cm$^2$:

The deposited layer was subjected to a high temperature electron beam (e-beam) treatment using a dose of about 200 micro c/cm2, at about 4.5 KeV and 1.5 mA, and at about 400° C. The e-beam treatment lasted for about 30 seconds. Following the e-beam treatment, the layer exhibited a dielectric constant of about 2.3 which is about 50% less than the non-cured layer. The e-beam layer also exhibited a hardness of about 0.7 GPa, which is about a 600% increase compared to the non-cured layer.

Additional description of methods of forming a porous low dielectric constant layer is described in commonly assigned U.S. Pat. No. 7,060,330, which is herein incorporated by reference.

Generally, the method of depositing the low dielectric constant silicon oxycarbide layer may be a plasma-enhanced chemical vapor deposition method. An example of a porous low dielectric constant silicon oxycarbide layer that may be used is a Black Diamonds® II layer, available from Applied Materials, Inc. An example of a chamber that may be used to deposit a low dielectric constant silicon oxycarbide layer is a Producer® chamber, available from Applied Materials, Inc.

A second dielectric layer 112 is formed over the first dielectric layer 110. The second dielectric layer 112 may be an organic layer, such as an amorphous carbon layer. An example of an amorphous carbon layer that may be used is an APF™ layer, available from Applied Materials, Inc. The organic layer may include polymeric materials. One example of a polymeric material is a spin-on organic material, such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel.

A method of forming an organic layer is as follows. Amorphous carbon material may be deposited by chemical vapor deposition (CVD) processes. In one embodiment of an amorphous carbon deposition process, the amorphous carbon layer is formed from a gas mixture of a hydrocarbon compound and an inert gas such as argon (Ar) or helium (He). The hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetelyne ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. The addition of $H_2$ and/or $NH_3$ can be used to control the hydrogen ratio of the amorphous carbon layer, as discussed below.

In general, the following deposition process parameters can be used to form the amorphous carbon layer. The process parameters range from a wafer temperature of about 100° C. to about 500° C., a chamber pressure of about 1 torr to about 20 torr, a hydrocarbon gas ($C_xH_y$) flow rate of about 50 sccm to about 500 sccm (per 8 inch wafer), a RF power of between about 3 W/in$^2$ to about 20 W/in$^2$, and a plate spacing of between about 300 mils to about 600 mils. The above process parameters provide a typical deposition rate for the amorphous carbon layer in the range of about 100 Å/min to about 1000 Å/min and can be implemented on a 200 mm substrate in a deposition chamber available from Applied Materials, Inc.

The as-deposited amorphous carbon layer has an adjustable carbon:hydrogen ratio that ranges from about 10% hydrogen to about 60% hydrogen. The light absorption coefficient, k, of the amorphous carbon layer can be varied between about 0.1 to about 1.0 at wavelengths below about 250 nm, making it suitable for use as an anti-reflective coating (ARC) at DUV wavelengths. The absorption coefficient of the amorphous carbon layer can also be varied as a function of the additive used in the gas mixture. In particular, the presence of $H_2$, $NH_3$, $N_2$ or combinations thereof, in the gas mixture can increase the k value by about 10% to about 100%.

In another embodiment of an amorphous carbon deposition process, the amorphous carbon layer is deposited by decomposing a gas mixture including a hydrocarbon compound and an inert gas at a low process temperature, e.g., below about 450 degrees Celsius. The hydrocarbon compound in the gas mixture may have greater than 5 carbon atoms to promote a conformal deposition reaction on the sidewall of substrate features and surface of the substrate, thereby improving the conformity and step coverage of the deposited amorphous carbon layer.

The amorphous carbon deposition process begins with the introduction of a gas mixture of at least one hydrocarbon compound and an inert gas into a process chamber. The hydrocarbon compound preferably has greater than 5 carbon atoms with a formula $C_xH_y$, where x has a range between 5 and 10 and y has a range of between 6 and 22. Suitable hydrocarbon compounds are saturated or unsaturated aliphatic or alicyclic hydrocarbons and aromatic hydrocarbons. Examples of suitable aliphatic hydrocarbons include, for example, alkanes such as pentane, hexane, heptane, octane, nonane, decane, and the like; alkenes such as pentene, and the like; dienes such as isoprene, pentadiene, hexadiene and the like; alkynes such as acetylene, vinylacetylene and the like. Examples of suitable alicyclic hydrocarbons include, for example, cyclopropane, cyclobutane, cyclopentane, cyclopentadiene, toluene, and the like. Examples of suitable aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3-tetramethylbutylbenzene, t-butylether, t-butylethylene, methylmethacrylate, and t-butylfurfurylether may be utilized. In the embodiment, the hydrocarbon compound in the gas mixture is toluene ($C_7H_8$), benzene, or hexane.

The hydrocarbon compound may further include oxygen, such as a compound that has an oxygen atom that substitutes a carbon in a benzene ring. Compounds for oxygen tailoring may contain a hydroxyl group. A mixture of two or more hydrocarbon compounds may be used to deposit the amorphous carbon material.

Alternatively, partially or completely doped derivatives of the hydrocarbon compounds may be used. The derivatives include nitrogen, fluorine, oxygen, hydroxyl group, and boron-containing derivatives of the hydrocarbon compounds as well as fluorinated derivatives thereof. Examples of fluorinated derivatives of hydrocarbon compounds are fluorinated alkanes, halogenated alkanes, and halogenated aromatic compounds. Fluorinated alkanes include, for example, monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes include monofluoroethylene, difluoroethylenes, trifluoroethylene, tetrafluoroethylene, monochloroethylene, dichloroethylenes, trichloroethylene, tetrachloroethylene, and the like. Halogenated aromatic compounds include monofluorobenzene, difluorobenzenes, tetrafluorobenzenes, hexafluorobenzene and the like.

The inert gas, such as argon (Ar) and/or helium (He), is supplied with the gas mixture into the process chamber. Other inert gases, such as nitrogen ($N_2$) and nitric oxide (NO), may also be used to control the density and deposition rate of the amorphous carbon layer. Additionally, a variety of other processing gases may be added to the gas mixture to modify properties of the amorphous carbon material. In one embodiment, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited amorphous carbon layer. The hydrogen ratio present in the amorphous carbon layer provides control over layer properties, such as reflectivity.

Conventional deposition processes are typically performed in excess of about 550 degrees Celsius. In one embodiment, the substrate temperature in the process chamber is maintained between about 100 degrees Celsius and about 500 degrees Celsius. In another embodiment, the substrate temperature is maintained between about 250 degrees Celsius and about 450 degrees Celsius. The amorphous carbon material may be deposited on a substrate in the present of RF plasma with the substrate temperature controlled below 450 degrees Celsius.

During deposition, process parameters may be regulated as needed. In one embodiment suitable for processing a 300 mm substrate, a RF power of between about 50 Watts to about 2000 Watts, such as 1000 Watts to about 1600 Watts, or a power density between 1.35 Watt/$cm_2$ and about 2.35 Watt/$cm_2$, may be applied to maintain a plasma formed from the gas mixture. The hydrocarbon compound may be supplied at a flow rate between about 200 sccm to about 1000 sccm. The inert gas may be supplied at a flow rate between about 200 sccm to about 10000 sccm. The process pressure may be maintained at about 1 Torr to about 20 Torr, for example, about 4 Torr to about 10 Torr. The spacing between the substrate and showerhead may be controlled at about 200 mils to about 1000 mils.

In one embodiment, a dual-frequency system is used to deposit the amorphous carbon material. The dual frequency is believed to provide independent control of flux and ion energy. The high frequency plasma controls plasma density. The low frequency plasma controls kinetic energy of the ions hitting the substrate surface. A dual-frequency source of mixed RF power provides a high frequency power in a range between about 10 MHz and about 30 MHz, for example, about 13.56 MHz, as well as a low frequency power in a range of between about 10 KHz and about 1 MHz, for example, about 350 KHz. An example of a mixed frequency RF power application may include a first RF power with a frequency in a range of about 10 MHz and about 30 MHz at a power in a range of about 50 watts to about 2000 watts, such as about 200 watts to about 1600 watts, and a power density of about 0.27 W/$cm^2$ to about 1.7 W/$cm^2$ and at least a second RF power with a frequency in a range of between about 10 KHz and about 1 MHz as well as a power in a range of about 10 watt to about 2000 watts, such as 15 watt to about 1000 watts, and a power density of about 0.27 W/$cm^2$ to about 1.4 W/$cm^2$. The ratio of the second RF power to the total mixed frequency power is preferably less than about 0.6 to 1.0 (0.6:1). The applied RF power and use of one or more frequencies may be varied based upon the substrate size and the equipment used.

In another embodiment of an amorphous carbon deposition process, the amorphous carbon layer is deposited by introducing a hydrocarbon source, a plasma-initiating gas, and a diluent gas into a processing chamber. The hydrocarbon source is a mixture of one or more hydrocarbon compounds, such as a gas-phase hydrocarbon compound, preferably $C_3H_6$, and/or a gas mixture including vapors of a liquid-phase hydrocarbon compound and a carrier gas. The plasma-initiating gas is preferably helium, because it is easily ionized, however other gases, such as argon, may also be used. The diluent gas is an easily ionized, relatively massive, and chemically inert gas, of which argon, krypton, and xenon are preferred.

Additionally, amorphous carbon layers formed using partially or completely doped derivatives of hydrocarbon compounds may also benefit from the inventive method. Derivatives include nitrogen-, fluorine-, oxygen-, hydroxyl group-, and boron-containing derivatives of hydrocarbon compounds as well as fluorinated derivatives thereof. The hydrocarbon compounds may contain nitrogen or be deposited with a nitrogen-containing gas, such as ammonia, or the hydrocarbon compounds may have substituents such as fluorine and oxygen. Any of these processes may benefit from the density, deposition rate and conformality improvements demonstrated for undoped amorphous carbon layers deposited with the inventive method. A more detailed description of doped derivatives of hydrocarbon compounds and combinations thereof that may be used in processes benefiting from aspects of the invention may be found in commonly assigned United States Pub. No. 2005/0287771 entitled "Liquid Precursors for the CVD deposition of Amorphous carbon Layers," filed on Feb. 24, 2005, which is hereby incorporated by reference in its entirety to the extent not inconsistent with the claimed invention.

Generally, hydrocarbon compounds or derivatives thereof that may be included in the hydrocarbon source may be described by the formula $C_AH_BO_CF_D$, where A has a range of between 1 and 24, B has a range of between 0 and 50, C has a range of 0 to 10, D has a range of 0 to 50, and the sum of B and D is at least 2. Specific examples of suitable hydrocarbon compounds include saturated or unsaturated aliphatic, saturated or unsaturated alicyclic hydrocarbons, and aromatic hydrocarbons.

Aliphatic hydrocarbons include, for example, alkanes such as methane, ethane, propane, butane, pentane, hexane, heptane, octane, nonane, decane, and the like; alkenes such as ethylene, propylene, butylene, pentene, and the like; dienes such as butadiene, isoprene, pentadiene, hexadiene and the like; alkynes such as acetylene, vinylacetylene and the like. Alicyclic hydrocarbons include, for example, cyclopropane, cyclobutane, cyclopentane, cyclopentadiene, toluene, and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3-tetramethylbutylbenzene, t-butylether, t-butylethylene, methyl-methacrylate, and t-butylfurfurylether may be selected.

Examples of suitable derivatives of hydrocarbon compounds are fluorinated alkanes, halogenated alkanes, and halogenated aromatic compounds. Fluorinated alkanes include, for example, monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes include monofluoroethylene, difluoroethylenes, trifluoroethylene, tetrafluoroethylene, monochloroethylene, dichloroethylenes, trichloroethylene, tetrachloroethylene, and the like. Halogenated aromatic compounds include monofluorobenzene, difluorobenzenes, tetrafluorobenzenes, hexafluorobenzene and the like.

The amorphous carbon deposition process with argon dilution is a PECVD process. The amorphous carbon layer may be deposited from the processing gas by maintaining a substrate temperature between about 100° C. and about 450° C. and preferably between about 300° C. and about 450° C. in order to minimize the coefficient of absorption of the resultant layer. The process further includes maintaining a chamber pressure between about 2 Torr and about 8 Torr. The hydrocarbon source, a plasma-initiating gas, and a diluent gas are introduced into the chamber and plasma is initiated to begin deposition. Preferably, the plasma-initiating gas is helium or another easily ionized gas and is introduced into the chamber before the hydrocarbon source and the diluent gas, which allows a stable plasma to be formed and reduces the chances of arcing. Plasma is generated by applying RF power at a power density to substrate surface area of between about 0.7 W/cm$^2$ and about 3 W/cm$^2$ and preferably about 1.1 to 2.3 W/cm$^2$. Electrode spacing, i.e., the distance between the substrate and the showerhead, is between about 200 mils and about 1000 mils.

A dual-frequency RF system may be used to generate plasma. The dual frequency is believed to provide independent control of flux and ion energy, since the energy of the ions hitting the layer surface influences the layer density. The high frequency plasma controls plasma density and the low frequency plasma controls kinetic energy of the ions hitting the wafer surface. A dual-frequency source of mixed RF power provides a high frequency power in a range between about 10 MHz and about 30 MHz, for example, about 13.56 MHz, as well as a low frequency power in a range of between about 10 KHz and about 1 MHz, for example, about 350 KHz. When a dual frequency RF system is used to deposit an amorphous carbon layer, the ratio of the second RF power to the total mixed frequency power is preferably less than about 0.6 to 1.0 (0.6:1). The applied RF power and use of one or more frequencies may be varied based upon the substrate size and the equipment used.

The ratio of molar flow rate of diluent, such as argon, to the molar flow rate of hydrocarbon compound into the PECVD chamber is preferably maintained between about 2:1 and about 40:1, depending on the desired properties of the deposited layer. For the deposition of some amorphous carbon layers, the most desirable range of this ratio is between about 10:1 and about 14:1.

An exemplary deposition process for processing 300 mm circular substrates employs helium as the plasma-initiating gas, $C_3H_6$ as the hydrocarbon source, and argon as the diluent gas. The flow rate of helium is between about 200 sccm and about 5000 sccm, the flow rate of $C_3H_6$ is between about 300 sccm and 600 sccm, and the flow rate of argon is between about 4000 sccm and about 10000 sccm. Single frequency RF power is between about 800 W and about 1600 W. Intensive parameters for this process, i.e., chamber pressure, substrate temperature, etc., are as described above. These process parameters provide a deposition rate for an amorphous carbon layer in the range of about 2000 Å/min to about 6000 Å/min, with a density in the range of about 1.2 g/cc and about 1.8 g/cc, and an absorption coefficient of about 0.10 for 633 nm radiation. One skilled in the art, upon reading the disclosure herein, can calculate appropriate process parameters in order to produce an amorphous carbon layer of different density, absorption coefficient, or deposition rate than those discussed herein.

Additional description of methods of forming an organic layer including depositing an amorphous carbon layer are described in commonly assigned U.S. Pat. No. 6,573,030, U.S. patent application Ser. No. 11/451,916, entitled "Methods for low temperature deposition of an amorphous carbon layer" and filed on Jun. 13, 2006, and U.S. patent application Ser. No. 11/427,324, entitled "Method for depositing an amorphous carbon layer with improved density and step coverage" and filed on Jun. 28, 2006, which are herein incorporated by reference.

Amorphous carbon layers deposited by other chemical vapor deposition (CVD) or plasma enhanced chemical vapor deposition (PECVD) methods my be used. An example of a chamber that may be used to deposit an amorphous carbon layer is a Producer® APF chamber, available from Applied Materials, Inc.

The organic layer may be deposited using a vapor deposition of an organic porogen-providing precursor, such as a hydrocarbon compound that may be used in combination with a silicon-containing precursor to form porous low dielectric constant silicon oxycarbide layers, such as the first dielectric layer 110. The organic layer and the low dielectric constant layer may be deposited in situ within the same processing chamber or processing tool. Additionally, the organic layer may be deposited in sequence on the low dielectric constant layer by the terminating the flow of the organosilicon compound in the deposition gases, and depositing the organic layer from the respective porogen-providing precursor used in the low dielectric constant deposition process.

Figure 2:
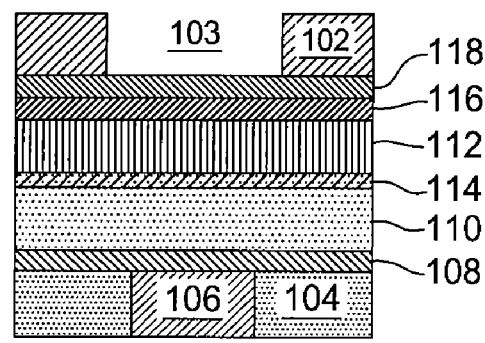
FIG. 2 is cross-sectional view of an alternative embodiment of the structure of FIG. 1A.

While layers 110 and 112 are shown in direct contact, in an alternative embodiment shown in FIG. 2, there is an etch stop layer 114 between layers 110 and 112. The etch stop layer 114 may be an oxide layer that provides enhanced etch selectivity between the layers 110 and 112 during subsequent processing steps. Alternatively, the etch stop layer 114 may be an oxidized upper surface of the first dielectric layer 110. The oxidized upper surface may be formed by increasing a flow of an oxidizing gas at the end of the deposition of the first dielectric layer, or the oxidized upper surface may be formed during a post-deposition curing step that is performed to create pores in the first dielectric layer.

Returning to FIG. 1A, a hard mask layer 116 is formed on the second dielectric layer 112. The hard mask layer 116 may be a silicon carbide layer. The structure 100 also includes an oxide layer 118 on the hard mask layer 116. The oxide layer 118 is a hard mask layer for a subsequently formed trench in the second dielectric layer, and the hard mask layer 116 acts as a hard mask for a subsequently formed via in the first dielectric layer.

Figure 1B:
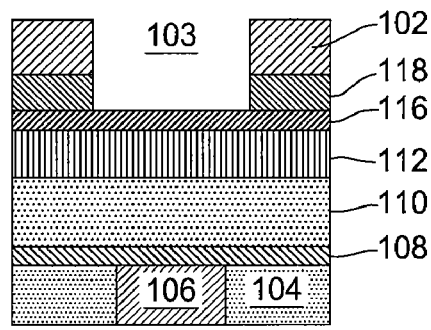

The first pattern 103 in the first photoresist material 102 is transferred through the oxide layer 118 with the layer 116 acting as an etch stop, as shown in FIG. 1B. The first pattern 103 in the first photoresist material 102 corresponds to the trench pattern that is formed in the second dielectric layer 112 in a later step.

Figure 1C:
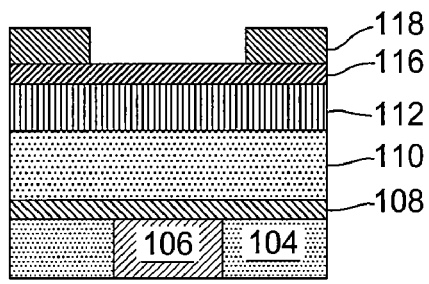
Figure 1D:
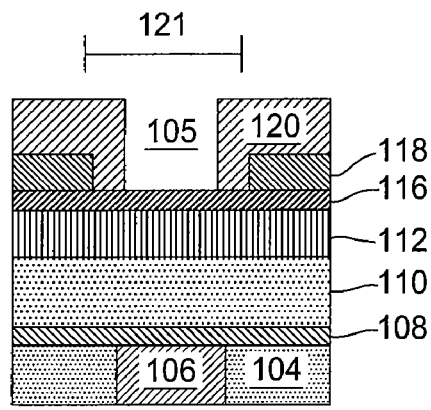
Figure 1E:
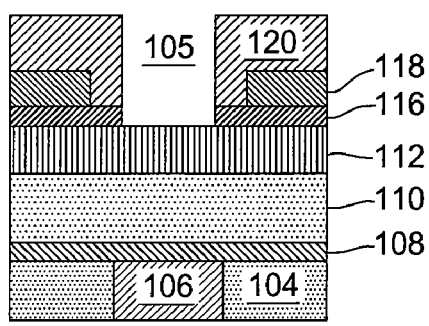

As shown in FIG. 1C, the first photoresist material 102 is then removed. Another second photoresist material 120 is then deposited and patterned with a second pattern 105, as shown in FIG. 1D. The second pattern 105 is located within a region of the second photoresist material 120 that is above the oxide layer region 121 of the oxide layer 118 that was removed when the first pattern 103 in the first photoresist material 102 was transferred through the oxide layer 118. Thus, the second pattern 105 in the second photoresist material 120 can be transferred directly through the hard mask layer 116 without being transferred through a portion of the oxide layer 118, as shown in FIG. 1E.

Figure 1F:
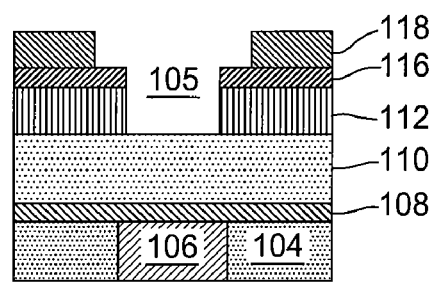
Figure 1G:
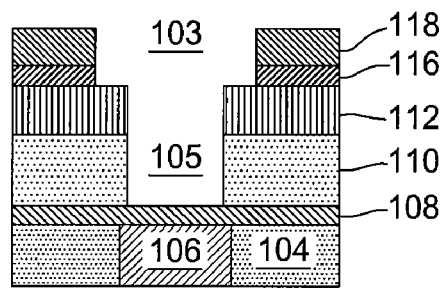
Figure 1H:
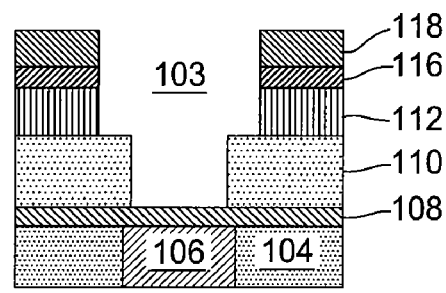
Figure 1:
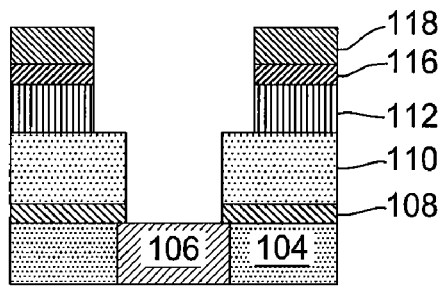

The second photoresist material 120 is then removed, and the second pattern 105 in the hard mask layer 116 is transferred through the second dielectric layer 112, as shown in FIG. 1F. The second pattern 105 in the mask layer 116 is also transferred through the first dielectric layer 110, as shown in FIG. 1G. The first pattern 103 in the oxide layer 118 created by the first photoresist material 102 is transferred into the hard mask layer 116, which is also shown in FIG. 1G. The pattern from first photoresist material 102 in the oxide layer and the hard mask layer 116 is then transferred through the second dielectric layer 112, as shown in FIG. 1H.

Next, the barrier layer 108 over the conductive feature 106 is etched to expose the conductive feature 106, as shown in FIG. 1I. Optionally, the structure 100 is pre-cleaned, such as with a plasma, before the barrier layer 108 is etched. An oxide seal layer (not shown) may be formed on the second dielectric layer 112 before the pre-cleaning to protect the second dielectric layer 112.

Figure 1J:
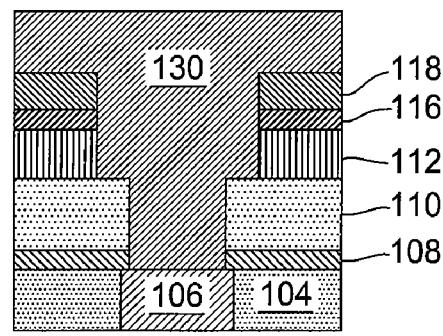

Then, as shown in FIG. 1J, a conductive material 130 is deposited on the structure 100. The conductive material 130 fills a trench level 131 formed in the second dielectric layer and a via level 133 formed in the first dielectric layer. Thus, in one aspect, the first dielectric layer 110 provides a via level dielectric having a via filled with conductive material therein, and the second dielectric layer 112 provides a trench level dielectric having a trench filled with conductive material therein. The conductive material may be copper, such as electroplated copper. The electroplated copper may be annealed after it is deposited. A barrier layer and seed layer (not shown) also may be deposited on the structure 100 before the conductive material 130 is deposited.

Figure 1K:
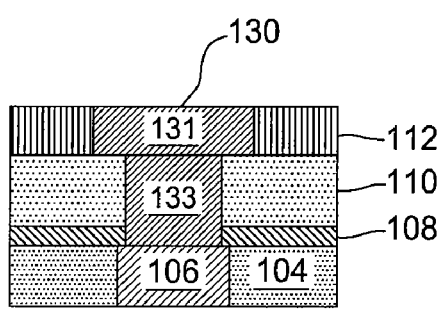

The conductive material is then planarized, such as by chemical mechanical polishing (CMP), as shown in FIG. 1K. The planarization also removes any remaining oxide layer 118 and hard mask layer 116.

Figure 1L:
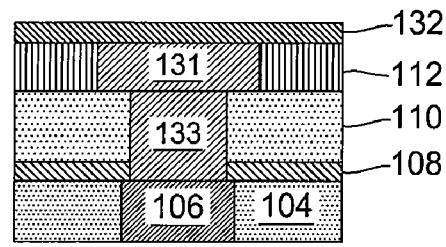
Figure 1M:
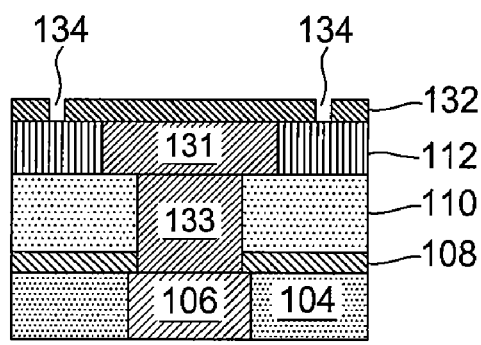

A layer 132 that may be a silicon carbide or doped silicon carbide layer is then deposited on the second dielectric layer 112 and the conductive material 130 in the trench level 131, as shown in FIG. 1L. Then apertures 134 are formed in the layer 132 over the second dielectric layer, as shown in FIG. 1M. The apertures 134 may be formed by patterning and etching the layer 132.

Figure 1N:
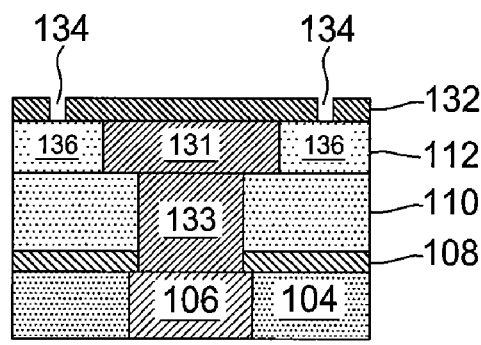

Then, a portion or all of the second dielectric layer 112 is removed through the apertures 134, leaving air gaps 136 in the place of the second dielectric layer 112, as shown in FIG. 1N. The dielectric layer 112 may be removed by a plasma process, such as an ashing process or a remotely generated plasma process. For example, an amorphous carbon dielectric layer may be removed by a dry etch process, such as an oxygen ashing process or a hydrogen ashing process.

One example of an ashing process is the removal of the amorphous carbon material from the low k dielectric material by subjecting the amorphous carbon layer to a plasma of a hydrogen-containing gas. The plasma treatment generally includes providing the hydrogen containing gas including hydrogen, ammonia, water vapor ($H_2O$), or combinations thereof, to a processing chamber at a flow rate between about 100 sccm and about 1000 sccm, preferably between about 500 sccm and about 1000 sccm, and generating a plasma in the processing chamber. The plasma may be generated using a power density ranging between about 0.15 $W/cm^2$ and about 5 $W/cm^2$, which is a RF power level of between about 50 W and about 1500 W for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is generally maintained at a chamber pressure of between about 1 Torr and about 10 Torr, preferably between about 3 Torr and about 8 Torr. The substrate is maintained at a temperature between about 100° C. and about 300° C. during the plasma treatment, preferably, between about 200° C. and about 300° C. The plasma treatment may be performed between about 15 seconds and about 120 seconds, or as necessary to remove the amorphous carbon material. The processing gas may be introduced into the chamber by a gas distributor, the gas distributor may be positioned between about 100 mils and about 2000 mils from the substrate surface, preferably positioned between about 200 mils and about 1000 mils, during the plasma treatment. However, it should be noted that the respective parameters may be modified to perform the plasma processes in various chambers and for different substrate sizes, such as 300 mm substrates.

The organic layer may also be removed by a wet etch process, a thermal annealing process, an ultra-violet curing process, an electronic beam (eBeam) curing process, or combinations thereof. An example of a wet etch process includes applying an etching solution, for example, a DHF solution comprising 6 parts of water and 1 part of hydrogen fluoride. Other wet etching chemicals, such as buffered hydrogen fluoride (BHF, $NH_4F+HF+H_2O$), may also be used to etch the amorphous carbon layer. Exemplary etching methods may be found in U.S. Pat. No. 6,936,183, entitled "Etch Process for Etching Microstructures", which is herein incorporated by reference.

An example of an ultra-violet cure process comprises providing a chamber pressure between about 2 torr and about 12 torr, providing a chamber temperature between about 50° C. and about 600° C., a UV source wavelength between about 200 nm and about 300 nm, a helium gas flow rate between about 100 sccm and 20,000 sccm, and optionally, additional gases such as argon, nitrogen, and oxygen or any combination thereof may be provided for the UV process. The UV power may be between about 25% and about 100% and the processing time period may be between about 0 minutes and about 200 minutes. The process may be carried out using a UV system manufactured by Applied Materials of Santa Clara, Calif., for example a NanoCure system. Other UV systems, such as the system described in U.S. patent application Ser. No. 11/124,908, filed on May 9, 2005, entitled TANDEM UV CHAMBER FOR CURING DIELECTRIC MATERIALS, published as U.S. 2006/0251827, which is herein incorporated by reference to the extent not inconsistent with the current specification, may also be used. This process may be carried out using a static or dual-sweeping source.

Figure 1O:
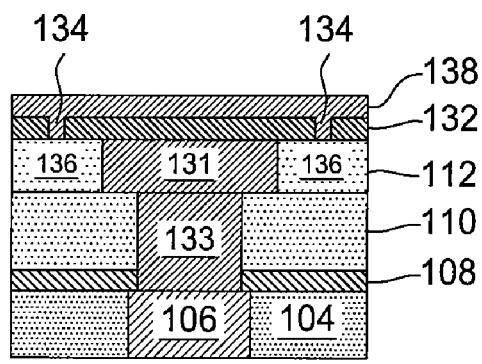

After the dielectric layer 112 is removed, a CVD layer 138 is deposited on the layer 132, as shown in FIG. 1O. The CVD layer may be a PECVD layer. The CVD layer provides a bridge or base layer for the deposition of subsequent levels of layers thereon.

The CVD layer 138 also fills the apertures 134 in the layer 132. The CVD layer may be a low dielectric constant layer comprising silicon, oxygen, and carbon. The low dielectric constant layer may be a substantially non-porous layer. The CVD layer may be formed by reacting an organosilicon compound with an oxidizing gas. Examples of organosilicon compounds that may be used include octamethylcyclotetrasiloxane (OMCTS) and trimethylsilane (TMS). Examples of oxidizing gases that may be used include oxygen ($O_2$), nitrous oxide ($N_2O$), carbon dioxide ($CO_2$), or combinations thereof.

It is recognized that damascene structures that include air gaps formed according to embodiments of the invention may need additional structural support to compensate for potentially mechanically weak areas created by the air gaps. Thus, the damascene structures may include "dummy" lines or interconnects at the trench level which do not provide functional interconnects in a completed device but instead provide structural support in a trench level layer that contains the air gaps.

While the foregoing is directed to embodiments of the present invention, other and further embodiments of the invention may be devised without departing from the basic scope thereof, and the scope thereof is determined by the claims that follow.

What is claimed is:

1. A method of forming a damascene structure, comprising:
   depositing a porous low dielectric constant layer by a method comprising:
      reacting an organosilicon compound and a porogen-providing precursor;
      depositing a porogen-containing material;
      removing at least a portion of the porogen-containing material;
   depositing an organic layer on the porous low dielectric constant layer by reacting the porogen-providing precursor;
   forming a feature definition in the organic layer and the porous low dielectric constant layer;
   filing the feature definition with a conductive material therein;
   depositing a mask layer on the organic layer and the conductive material disposed in the feature definition;
   forming apertures in the mask layer to expose the organic layer;
   removing a portion or all of the organic layer through the apertures; and
   forming an air gap adjacent the conductive material, wherein the removing a portion or all of the organic layer comprises removing the organic layer material by a plasma etch process, a thermal annealing process, an ultra-violet curing process, an electronic beam curing process, a wet etch process, or a combination thereof.

2. The method of claim 1, wherein the organic layer comprises an amorphous carbon layer.

3. The method of claim 1, wherein the porogen-providing precursor is alpha-terpinene.

4. The method of claim 1, further comprising depositing a non-porous low dielectric constant material on the mask material after the removing the portion or all of the organic layer through the apertures.

5. The method of claim 1, further comprising forming an etch stop between the porous low dielectric constant layer and the organic layer.

6. The method of claim 5, wherein the etch stop is an oxidized upper surface of the porous low dielectric constant layer.

7. The method of claim 1, wherein the mask layer comprises silicon carbide material or a doped silicon carbide material.

8. The method of claim 1, wherein the porous low dielectric constant layer is a silicon oxycarbide layer.

9. The method of claim 1, wherein depositing an organic layer comprises depositing an amorphous carbon layer by reacting the porogen-providing precursor in a chemical vapor deposition process.

10. The method of claim 1, wherein the porous low dielectric constant layer and the organic layer are deposited in-situ in the same processing chamber or processing tool.

11. The method of claim 1, further comprising forming an etch stop between the porous low dielectric constant layer and the organic layer.

12. A method of forming a damascene structure, comprising:
   depositing a porous low dielectric constant layer by a method comprising:
      reacting an organosilicon compound and a porogen-providing precursor;
      depositing a porogen-containing material;
      removing at least a portion of the porogen-containing material;
   depositing an organic layer on the porous low dielectric constant layer by reacting the porogen-providing precursor;
   forming a feature definition in the organic layer and the porous low dielectric constant layer;
   filing the feature definition with a conductive material therein;
   depositing a mask layer on the organic layer and the conductive material disposed in the feature definition;
   forming apertures in the mask layer to expose the organic layer;
   removing a portion or all of the organic layer through the apertures; and
   forming an air gap adjacent the conductive material, wherein the forming the feature definition comprises:
      depositing a hard mask layer on the organic layer;
      forming a first pattern in the hard mask layer;
      transferring the pattern in the hard mask layer through the organic layer;
      transferring the pattern in the hard mask layer through the porous low dielectric constant layer to form a via in the porous low dielectric constant layer;
      forming a second pattern in the hard mask layer; and
      transferring the second pattern through the second dielectric layer to form a trench in the organic layer.

13. The method of claim 12, further comprising forming a barrier layer between the low dielectric constant material and an underlying conductive feature.

14. The method of claim 13, further comprising removing the barrier layer over the conductive feature after the second pattern is transferred through the organic layer.

15. A method of forming a damascene structure, comprising:

depositing a porous low dielectric constant layer by a method comprising:
  reacting an organosilicon compound and alpha-terpinene;
  depositing an alpha-terpinene containing material;
  removing at least a portion of alpha-terpinine in the alpha-terpinene containing material;
depositing an amorphous carbon layer on the porous low dielectric constant layer by reacting alpha-terpinene;
forming a feature definition in the amorphous carbon layer and the porous low dielectric constant layer;
filing the feature definition with a conductive material therein;
depositing a silicon carbide-based material on the amorphous carbon layer and the conductive material disposed in the feature definition;
forming apertures in the silicon carbide-based material to expose the amorphous carbon layer;
removing a portion or all of the amorphous carbon layer through the apertures; and
forming an air gap adjacent the conductive material, wherein the removing a portion or all of the amorphous carbon layer through the apertures comprises removing amorphous carbon material by a plasma etch process, a wet etch process, an annealing process, an electronic beam cure process, an ultra-violet light curing process, or a combination thereof.

16. The method of claim 15, further comprising depositing a low dielectric constant material on the silicon carbide-based material after the removing a portion or all of the amorphous carbon layer.

17. The method of claim 15, wherein the porous low dielectric constant layer and the amorphous carbon layer are deposited in-situ in the same processing chamber or processing tool.

18. A method of forming a damascene structure, comprising:
  depositing a porous low dielectric constant layer by a method comprising:
    reacting an organosilicon compound and alpha-terpinene;
    depositing an alpha-terpinene containing material; and
    removing at least a portion of alpha-terpinine in the alpha-terpinene containing material;
  in situ depositing an amorphous carbon layer on the porous low dielectric constant layer by reacting alpha-terpinene;
  forming a feature definition in the amorphous carbon layer and the porous low dielectric constant layer;
  filing the feature definition with a conductive material therein;
  depositing a silicon carbide-based material on the amorphous carbon layer and the conductive material disposed in the feature definition;
  forming apertures in the silicon carbide-based material to expose the amorphous carbon layer;
  removing a portion or all of the amorphous carbon layer through the apertures by a plasma etch process, a wet etch process, an annealing process, an electronic beam cure process, an ultra-violet light curing process, or a combination thereof;
  forming an air gap adjacent the conductive material; and
  depositing a non-porous low dielectric constant layer on the silicon-carbide material.

* * * * *

UNITED STATES PATENT AND TRADEMARK OFFICE
CERTIFICATE OF CORRECTION

| | |
|---|---|
| PATENT NO. | : 7,670,924 B2 |
| APPLICATION NO. | : 12/017930 |
| DATED | : March 2, 2010 |
| INVENTOR(S) | : Demos et al. |

It is certified that error appears in the above-identified patent and that said Letters Patent is hereby corrected as shown below:

Column 5, Line 3, please delete "dimethyidimethoxysilane" and insert --dimethyldimethoxysilane-- therefor;

Column 8, Line 6, please delete "Micro" and insert --micro-- therefor;

Column 8, Line 46, please delete "Micro" and insert --micro-- therefor;

Column 9, Line 9, please delete "Micro" and insert --micro-- therefor.

Signed and Sealed this

Fifteenth Day of June, 2010

David J. Kappos
*Director of the United States Patent and Trademark Office*